United States Patent
Matsui

(10) Patent No.: US 7,623,347 B2
(45) Date of Patent: Nov. 24, 2009

(54) ELECTRIC DEVICE HAVING FIRST AND SECOND ELECTRIC ELEMENTS

(75) Inventor: Yuusuke Matsui, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/071,410

(22) Filed: Feb. 21, 2008

(65) Prior Publication Data

US 2008/0204998 A1  Aug. 28, 2008

(30) Foreign Application Priority Data

Feb. 23, 2007  (JP) .............................. 2007-43853

(51) Int. Cl.
*H05K 7/20* (2006.01)
(52) U.S. Cl. .................. 361/695; 361/722; 361/715
(58) Field of Classification Search .................. None
See application file for complete search history.

(56) References Cited

U.S. PATENT DOCUMENTS

| | | | | |
|---|---|---|---|---|
| 5,218,516 A | * | 6/1993 | Collins et al. | 361/721 |
| 5,224,023 A | * | 6/1993 | Smith et al. | 361/784 |
| 5,276,584 A | * | 1/1994 | Collins et al. | 361/718 |
| 5,452,182 A | * | 9/1995 | Eichelberger et al. | 361/749 |
| 5,812,375 A | * | 9/1998 | Casperson | 361/707 |
| 5,831,828 A | * | 11/1998 | Cutting et al. | 361/704 |
| 6,154,367 A | * | 11/2000 | Pavlovic | 361/707 |
| 6,212,076 B1 | * | 4/2001 | MacQuarrie et al. | 361/720 |
| 6,341,066 B1 | | 1/2002 | Murowaki et al. | |
| 7,036,214 B2 | | 5/2006 | Kondo et al. | |
| 7,224,583 B2 | | 5/2007 | Marumoto | |
| 2003/0095389 A1 | * | 5/2003 | Samant et al. | 361/749 |
| 2006/0088263 A1 | | 4/2006 | Tanaka et al. | |
| 2006/0209515 A1 | * | 9/2006 | Moshayedi | 361/715 |
| 2006/0225276 A1 | * | 10/2006 | Morita | 29/854 |

FOREIGN PATENT DOCUMENTS

| | | |
|---|---|---|
| JP | A-06-216537 | 8/1994 |
| JP | A-11-220278 | 8/1999 |
| JP | A-2001-332885 | 11/2001 |
| JP | A-2004-342325 | 12/2004 |
| JP | A-2007-019282 | 1/2007 |

OTHER PUBLICATIONS

Office Action dated Jan. 21, 2009 in corresponding Japanese patent application No. 2007-043853 (and English translation).

* cited by examiner

*Primary Examiner*—Gregory D Thompson
(74) *Attorney, Agent, or Firm*—Posz Law Group, PLC

(57) ABSTRACT

An electric device includes: first and second electric elements, wherein electric power consumption and operation temperature limit of the first electric element is larger than the second electric element; a substrate made of a rigid flexible board; and a casing that accommodates the substrate with the first and second electric elements. The substrate includes first and second rigid portions and a flexible portion. The first and second electric elements are disposed on the first and second rigid portion, respectively. The flexible portion connects the first and second rigid portions. The thickness of the flexible portion is smaller than the first and second rigid portions. The flexible portion further includes a wiring for electrically coupling the first and second electric elements so that high speed communication is performed between the first and second electric elements.

12 Claims, 4 Drawing Sheets

ELECTRIC DEVICE HAVING FIRST AND SECOND ELECTRIC ELEMENTS

CROSS REFERENCE TO RELATED APPLICATION

This application is based on Japanese Patent Application No. 2007-43853 filed on Feb. 23, 2007, the disclosure of which is incorporated herein by reference.

FIELD OF THE INVENTION

The present invention relates to an electric device having first and second electric elements.

BACKGROUND OF THE INVENTION

Dimensions of a printed circuit board can be reduced by using an element built-in technique and a multi-layered technique. Further, the size of the entire electric device also can be reduced.

As shown in FIG. 6, when a printed circuit board 1 includes a large heat generation electric element 2, which consumes a large amount of electricity and generates a large amount of heat, if the dimensions of the printed circuit board 1 are minimized, the operation specifications of a small heat generation electric element 3, 4, 5 may be not satisfied. Here, the small heat generation electric element 3, 4, 5 consumes a small amount of electricity and has a low proper operation temperature limit. The large heat generation electric element 2 consumes a large amount of electricity and has a high proper operation temperature limit. The heat generated in the large heat generation electric element 2 affects the small heat generation electric element 3, 4, 5 by heat conduction of the printed circuit board 1. Therefore, the temperature may exceed the low proper operation temperature limit of the small heat generation electric element 3, 4, 5.

In view of the above difficulty, it is necessary to have a large heat radiation fin for radiating heat from the large heat generation electric element 2. Thus, the dimensions of the device increase. Further, as shown in FIG. 7, when a cooling fan 7 is formed on a casing 6, it is necessary to increase air blow volume of the fan 7. In this case, noise from the fan 7 may cause difficulty. The fan may generate an operation noise. Further, when the small heat generation electric element 3, 4, 5 is disposed on a downstream side of the large heat generation electric element 2, heat convection from the large heat generation electric element 2 and/or heat radiation from the large heat generation electric element 2 may affect the small heat generation electric element 3, 4, 5.

Thus, the printed circuit board 1 may be divided into two independent boards, so that the large heat generation electric element 2 is mounted on one independent board, and the small heat generation electric element 3, 4, 5 is mounted on the other independent board. Thus, the heat from the large heat generation electric element 2 does not affect the small heat generation electric element 3, 4, 5. However, in this case, when it is necessary to connect between the large heat generation electric element 2 and the small heat generation electric element 3, 4, 5 in order to communicate therebetween with high speed, impedance mismatch may be caused by a contact resistance when a connector connects the large heat generation electric element 2 and the small heat generation electric element 3, 4, 5.

Thus, it is required to connect between the large heat generation electric element 2 and the small heat generation electric element 3, 4, 5 with high speed communication.

SUMMARY OF THE INVENTION

In view of the above-described problem, it is an object of the present disclosure to provide an electric device having first and second electric elements.

According to an aspect of the present disclosure, an electric device includes: first and second electric elements, wherein electric power consumption of the first electric element is larger than that of the second electric element, and wherein operation temperature limit of the first electric element is higher than that of the second electric element; a substrate, on which the first and second electric elements are disposed; and a casing that accommodates the substrate with the first and second electric elements. The substrate is made of a rigid flexible board. The substrate includes first and second rigid portions and a flexible portion. The first electric element is disposed on the first rigid portion, and the second electric element is disposed on the second rigid portion. The flexible portion connects the first and second rigid portions. The flexible portion has a thickness, which is smaller than the first and second rigid portions. The flexible portion further includes a wiring. The first and second electric elements are electrically coupled with the wiring so that high speed communication is performed between the first and second electric elements.

In the above device, thermal conduction from the first electric element to the second electric element is limited by the flexible portion. Thus, the heat from the first electric element does not affect the second electric element substantially, so that the device can function appropriately. Further, since the first and second electric elements are connected with the wiring, the high speed communication can be performed between the first and second electric elements without causing impedance mismatching.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
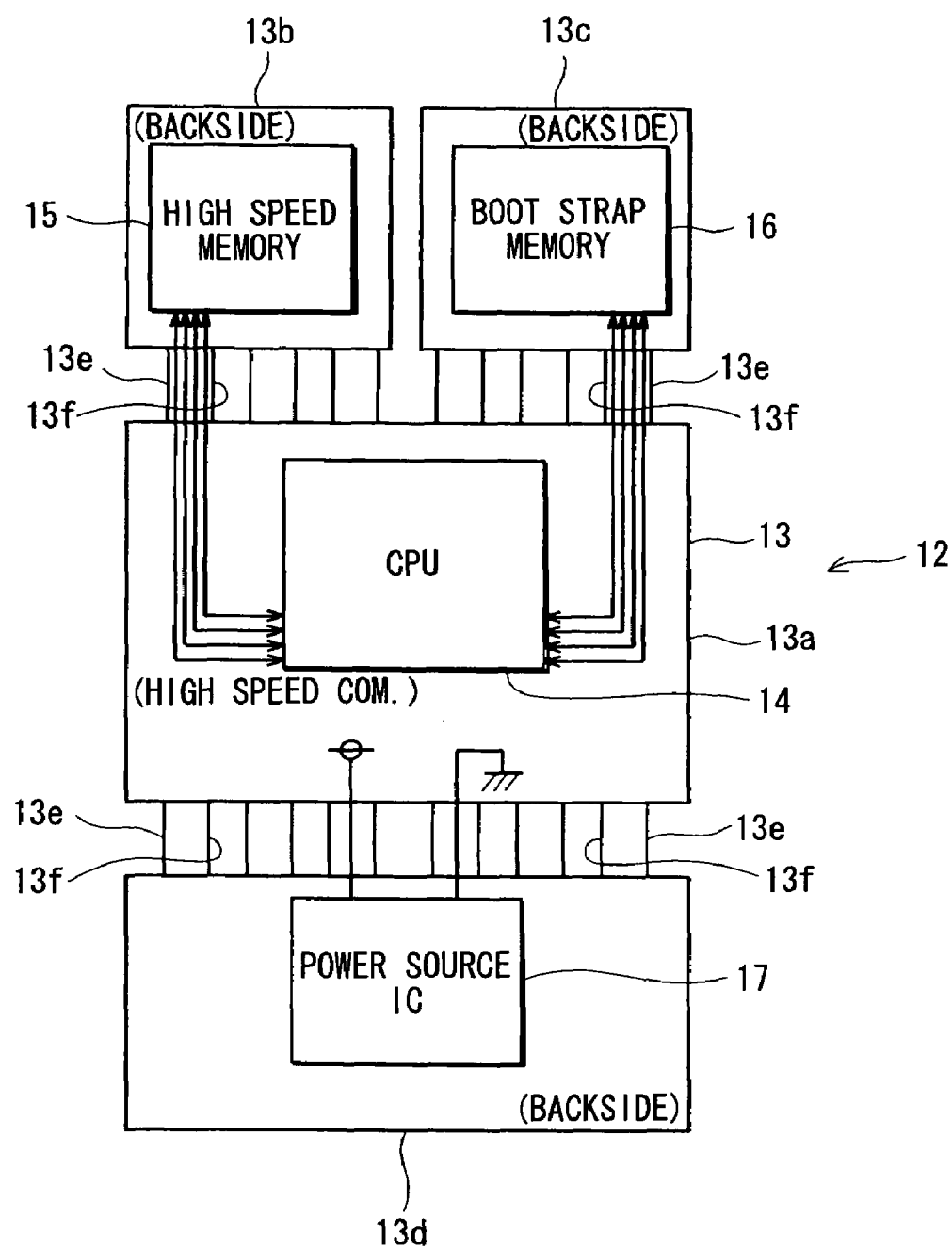
FIG. 1 is a plan view showing a rigid flexible board according to an example embodiment.
Figure 2:
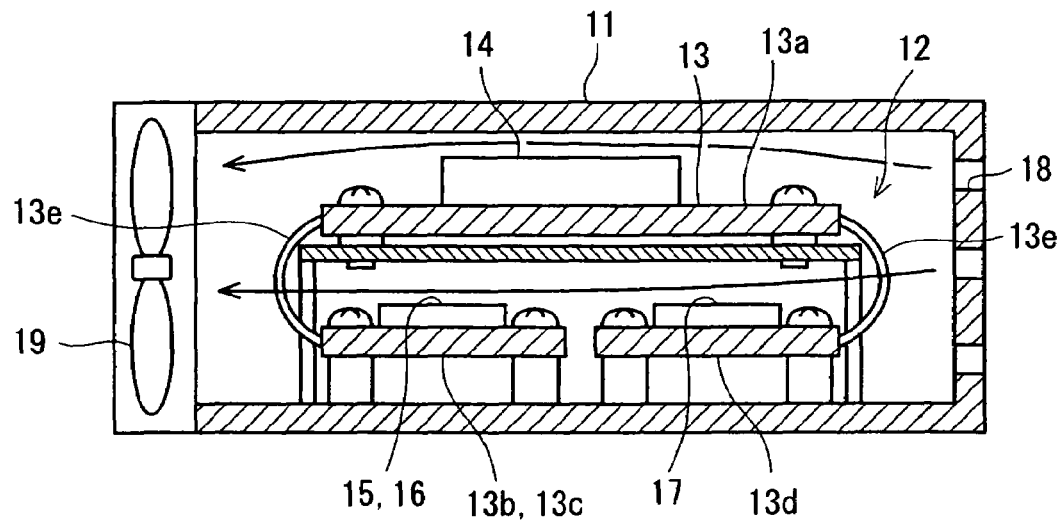
FIG. 2 is a cross sectional view showing the rigid flexible board in a casing.

An electric device having a large heat generation electric element and a small heat generation electric element is, for example, a vehicle navigation device according to an example embodiment. The navigation device is mounted on a vehicle. The navigation device shown in FIG. 2 includes a casing 11 and a control unit 12, which is accommodated in the casing 11. The control unit 12 is mainly composed of a rigid flexible board 13. FIG. 1 shows the rigid flexible board 13. The board 13 includes first to fourth rigid portions 13a-13d and a flexible portion 13e. The first to fourth rigid portions 13a-13d are connected to each other with the flexible portion 13e. A CPU (i.e., central processing unit) 14 and a periphery circuit (not shown) such as a clock circuit, a reset circuit, a I/O circuit and the like are formed on the first rigid portion 13a. The CPU 14 controls a control unit, and corresponds to, for example, a large heat generation electric element and a micro processor. The CPU 14 performs high speed operation, so that the CPU 14 consumes large amount of electricity. Thus, the CPU 14 generates large amount of heat. Further, proper operation temperature limit of the CPU 14 is high. A high speed memory 15 (corresponding to a small heat generation electric element) is mounted on the second rigid portion 13b. The high speed memory 15 is a DDR (i.e., double data rate) memory so that communication speed of the DDR memory is twice higher than that of a normal memory. The high speed memory 15 consumes small amount of electricity and generates small amount of heat. Thus, proper operation temperature limit of the high speed memory 15 is low.

A boot strap memory 16 is mounted on the third rigid portion 13c. When the CPU 14 starts to operate, the CPU 14 firstly accesses the boot strap memory 16. The boot strap memory 16 stores a boot strap program, which performs to read and input an OS (i.e., operating system) from a hard disk (not shown) to the CPU 14. The boot strap memory 16 consumes small amount of electricity and generates small amount of heat. Thus, proper operation temperature limit of the boot strap memory 16 is low.

A power source circuit such as a power source IC 17 and the like is mounted on the fourth rigid portion 13d. When a driver of the vehicle turns on an ignition switch so that accessories of the vehicle turn on, a voltage output from a battery maintains to be a predetermined voltage. Under this stable condition of the voltage, the power source IC 17 supplies electricity to electric elements such as the CPU 14, the high speed memory 15 and the boot strap memory 16. The power source IC 17 functions efficiently. Thus, electricity consumption of the power source IC 17 is quite small, and heat generation is also quite small. Thus, proper operation temperature limit of the power source IC 17 is low.

Each electric element such as the high speed memory 15, the boot strap memory 16 and the power source IC 17 is mounted on a backside of the rigid portion 13b-13d. This is because the rigid portions 13b-13d are arranged to be reversed when the rigid flexible board 13 is mounted in the casing 11.

The first rigid portion 13a is connected to the second to fourth rigid portions 13b-13d with the flexible portion 13e having a small thickness. Further, electric elements in the rigid portions 13a-13d are electrically connected to each other with a wiring pattern of the flexible portion 13e. The flexible portion 13e has a lattice shape, which is divided by a slit 13f.

Figure 3:
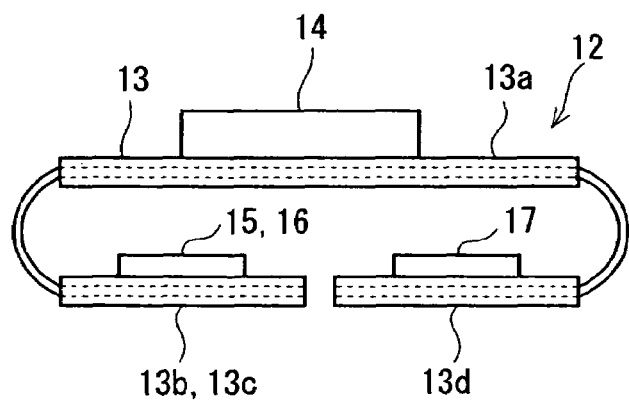
FIG. 3 is a cross sectional view showing arrangement of the rigid flexible board in the casing.
Figure 4:
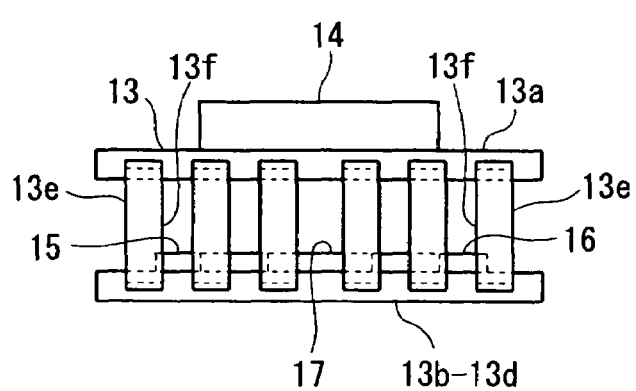
FIG. 4 is a front view showing the arrangement of the rigid flexible board in the casing.

When the rigid flexible board 13 is mounted in the casing 11, the first rigid portion 13a is arranged in parallel to the second to fourth rigid portions 13b-13d. Specifically, the first rigid portion 13a is spaced a part from the second to fourth rigid portions 13b-13d by a predetermined distance in an up and down direction. The first rigid portion 13a is disposed over the second to fourth rigid portions 13b-13d. In this case, the second to fourth rigid portions 13b-13d are reversed so that an element mounting surface of each rigid portion 13b-13d faces the first rigid portion 13a. The flexible portion 13e connecting between the first rigid portion 13a and the second to fourth rigid portions 13b-13d is bent, as shown in FIGS. 3 and 4. The flexible portion 13e is divided by the slit 13f in a longitudinal direction of the flexible portion 13e so that the flexible portion 13e has a stripe shape.

The casing 11 has a suction opening 18 disposed on a front side of the casing 11, and a cooling fan 19 is mounted on a back side of the casing 11. When the cooling fan 19 works, air introduced from the suction opening 18 passes through the casing 11, and then, the air is discharged to the outside of the casing 11. The cooling fan 19 is connected to the battery with the ignition switch. Therefore, when the ignition switch turns on so that the accessories are switched on, the cooling fan 19 is energized and operated.

The rigid flexible board 13 is manufactured by using a method disclosed in JP-A-2003-264369 corresponding to U.S. Pat. No. 7,036,214.

Figure 5A:
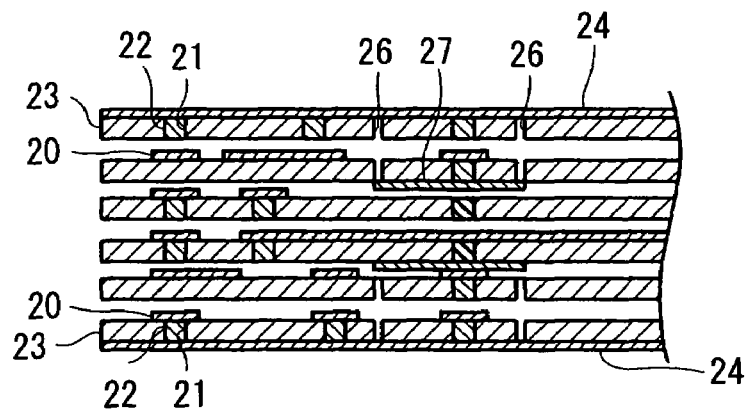
FIGS. 5A to 5C are cross sectional views showing a method for manufacturing the rigid flexible board.
Figure 5B:
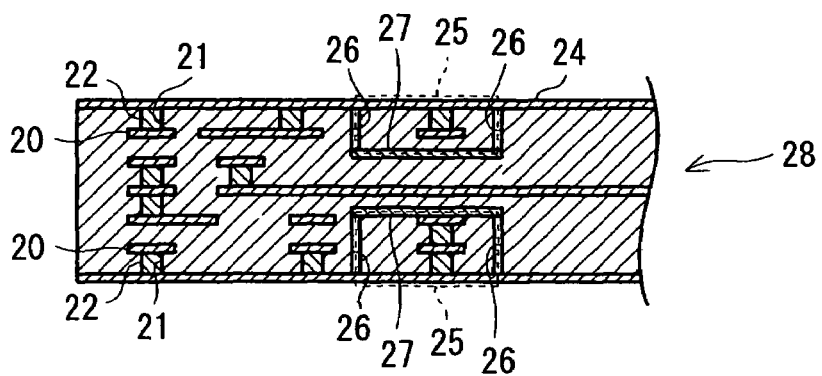
Figure 5C:
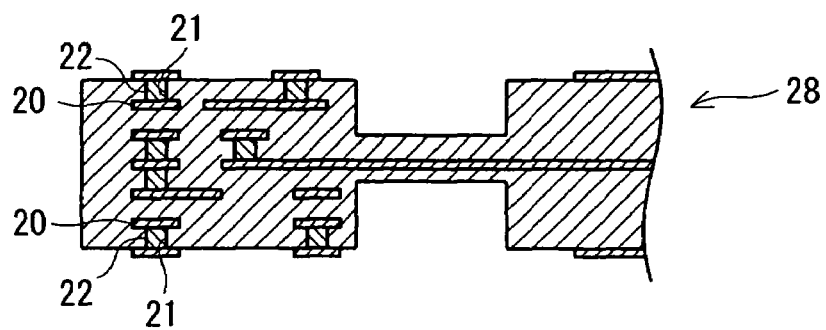

FIGS. 5A to 5C show a manufacturing process of the rigid flexible board 13. A conductive pattern 20 is formed on a one-side conductive pattern film 23. The film 23 has a via hole 21, in which a conductive paste 22 is filled. Multiple films 23 are stacked in such a manner that each conductive pattern 20 turns upward. In FIG. 5A, six films 23 are stacked. A copper film 24 as a conductive foil is formed on an utmost down side of the stacked films 23 so that the copper film 24 is formed on an outer side of the stacked films 23. Further, the one-side conductive pattern film 23 disposed on an utmost upside of the stacked films 23 has no conductive pattern 20, but has the copper film 24, which is not patterned. Before stacked, a slit 26 is preliminarily formed on a side of a remove region 25, and a separation sheet 27 is formed on a bottom of the remove region 25. After stacked, the remove region 25 is removed so that the flexible portion 13e is formed. Thus, the remove region 25 is disposed over and under the flexible portion 13e.

The stacked films 23 is pressed and heated by a pair of hot press plates in a vacuum hot press equipment so that both sides of the stacked films 23 are pressed and heated. As shown in FIG. 5B, the one-side conductive pattern film 23 and the copper film 24 are bonded to each other so that the films 23 are thermally bonded and integrated. Further, the conductive paste 22 in the via hole 21 connects adjacent conductive patterns 20 and copper film 24 so that interlayer connection is performed. Thus, a multi-layer board 28 is formed. In the board 28, both sides of the board 28 are covered with the copper film 24.

Next, the copper film 24 disposed on a surface of the multi-layer board 28 is etched so that a predetermined pattern is formed. Accordingly, as shown in FIG. 5C, the conductive pattern is formed on an utmost outer side of the multi-layer board 28.

Finally, the remove region 25 is separated from the multi-layer board 28. In this case, the side of the remove region 25 is surrounded with the slit 26, and further, the separation sheet 27 is arranged on the bottom of the remove region 25. Thus, the remove region 25 is easily removed from the multi-layer board 28.

The slit 13f of the flexible portion 13e can be easily formed by arranging two separation sheets 27 in the multi-layer board 28, the two sheets 27 which are stacked, so that two remove regions 25 facing each other are easily removed.

Thus, the first rigid portion 13a is connected to the second to fourth rigid portions 13b-13d with the flexible portion 13e. Further, the first to fourth rigid portions 13a-13d are electrically coupled with the wiring pattern on the flexible portion 13e so that the rigid flexible board 13 is manufactured. Furthermore, the conductive pattern including an electrode may be formed on both sides of the first to fourth rigid portions 13a-13d. Then, an electric element is mounted on the rigid flexible board 13 with solder. Thus, the control unit 12 is completed.

Then, the control unit 12 is mounted in the casing 11 so that the control unit 12 is connected to a hard disk (not shown), a display element (not shown) and the like. Thus, the vehicle navigation device is formed.

When the navigation device is mounted on the vehicle, and a driver turns on the ignition switch, a power source IC 17, which is mounted on the fourth rigid portion 13d, is energized. Thus, a voltage, which is stabilized by the power source IC 17, is supplied to the CPU 14. At the same time, a battery energizes the cooling fan 19, so that the cooling fan 19 functions to discharge the air in the casing 11 to the outside of the casing 11.

When the CPU 14 starts to function, a boot strap program outputted from the boot strap memory 16 is performed, so that an OS memorized in the hard disk is output and executed. By using the OS, a program for the navigation device is performed. In accordance with the program for the navigation device, a data is read out form the hard disk. If necessary, the data is memorized as a working data in the high speed memory 15. Further, the data is read out from the high speed memory 15 in order to output to the display element.

When the CPU 14 functions with high speed, the CPU 14 generates heat because electric power consumption in the CPU 14 is large. Thus, the temperature of the CPU 14 increases. When the temperature of the CPU 14 increases, the heat from the CPU 14 conducts to the first rigid portion 13a. Thus, the temperature of the first rigid portion 13a increases. In this case, the operation temperature limit of the CPU 14 is sufficiently high. Further, the cooling fan 19 cools the CPU 14 intensively. Thus, even if the temperature of the CPU 14 increases, the operational specification of the navigation device is satisfied.

Figure 6:
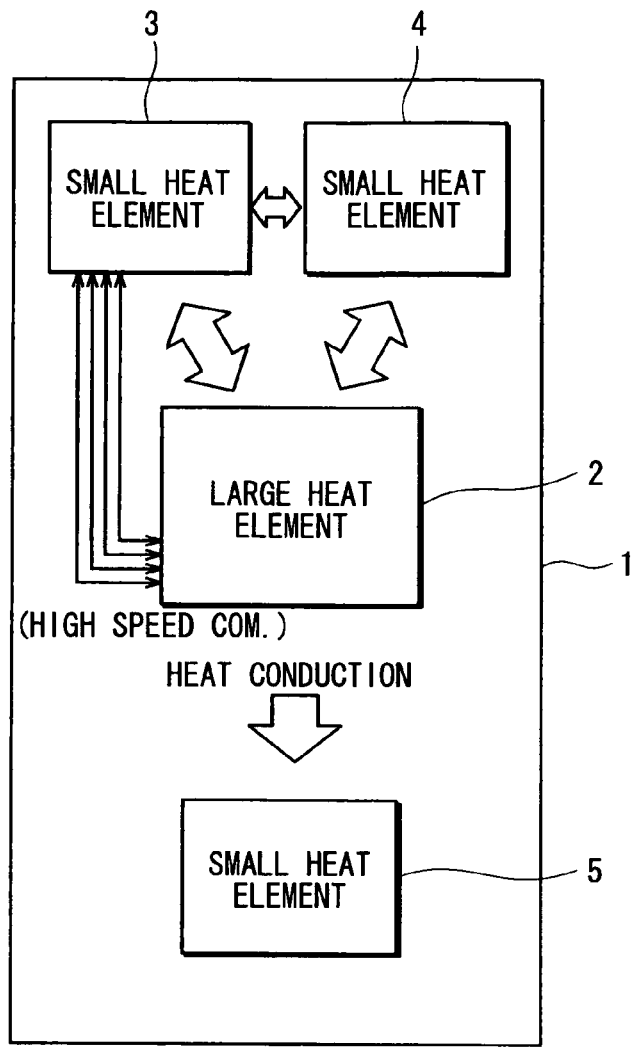
FIG. 6 is a plan view showing a circuit board according to a related art.
Figure 7:
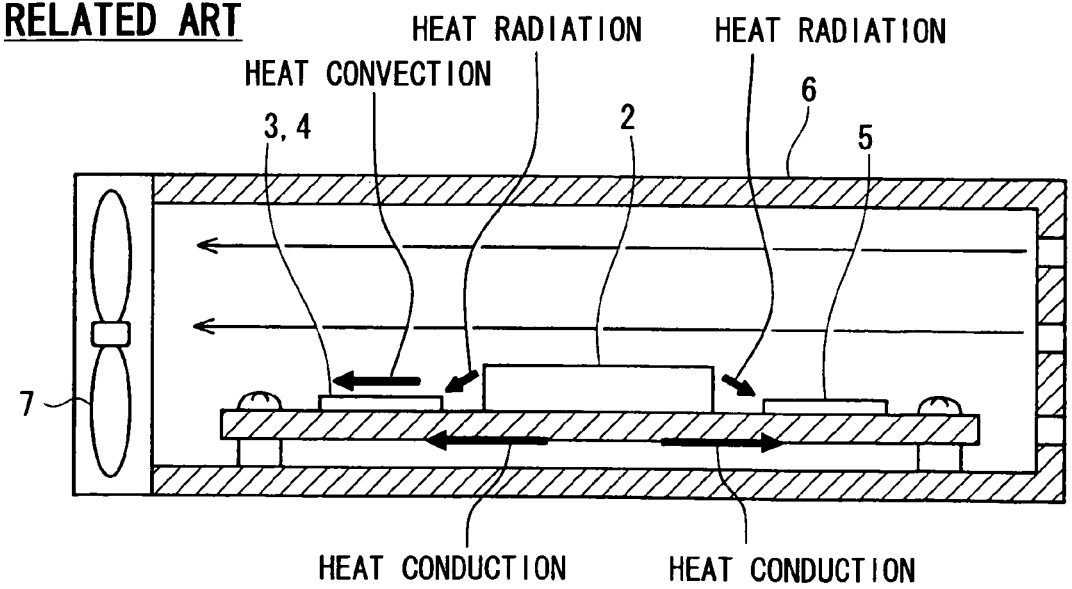
FIG. 7 is a cross sectional view showing the circuit board in a casing according to the related art.

Each of the memory 15 mounted on the second rigid portion 13b, the memory 16 mounted on the third rigid portion 13c and the IC 17 mounted on the fourth rigid portion 13d has comparatively small electric power consumption, so that each generates comparatively small amount of heat. However, the heat conducted from the first rigid portion 13a may affect the second to fourth rigid portions 13b-13d so that the temperature exceeds the operation temperature limit of the memory 15, the memory 16 or the IC 17, and the operational specification of the navigation device may not be satisfied. However, in this embodiment, since the second to fourth rigid portions 13b-13d are connected to the first rigid portion 13a with the flexible portion 13e having a small thickness, the heat conduction from the first rigid portion 13a to the second to fourth rigid portions 13b-13d is limited. Thus, although the temperature of the first rigid portion 13a increases with heat generation of the CPU 14, the temperature of each of the second to fourth rigid portions 13b-13d does not increase excessively. Thus, the structure of the navigation device prevents the temperature of each of the memory 15, the memory 16 and the IC 17 from increasing excessively. Thus, even when the operation temperature limit of each of the memory 15, the memory 16 and the IC 17 is comparatively low, the memory 15, the memory 16 and the IC 17 function appropriately, compared with a case where the elements 2, 3 having different operation temperature limits are mounted on one printed circuit board 1 shown in FIG. 6. Further, the dimensions of the navigation device are reduced.

Since the CPU 14 is connected to the high speed memory 15 with the wiring pattern on the flexible portion 13e, high speed communication between the first and second rigid portions 13a-13b can be performed without causing impedance mismatch, which is generated by a contact resistance when a connector connects the CPU 14 and the memories 15, 16 and the IC 17.

The flexible portion 13e connecting between the first and second rigid portions 13a, 13b has a stripe shape, which is divided by the slit 13f. Therefore, the flexible portion 13e does not prevent the air from flowing through the device when the cooling fan 19 forcibly air-cools the CPU 14. Further, heat radiation from the flexible portion 13e is effectively improved.

The first rigid portion 13a, on which the CPU 14 is mounted, is arranged over the memories 15, 16 and the IC 17. Therefore, heat radiation and heat convection from the CPU 14 does not affect the memories 15, 16 and the IC 17 substantially.

Further, since the cooling fan 19 cools the CPU 14 effectively, the performance of the cooling fan 19 is designed by considering the cooling of the CPU 14 only. Thus, the dimensions of the cooling fan 19 are reduced, so that the device includes a small size cooling fan 19.

Although no electric element is mounted on a front side of the second to fourth rigid portions 13b-13d, electric elements may be mounted on the front side of the second to fourth rigid portions 13b-13d.

Although the flowing direction of the air from the cooling fan 19 is perpendicular to the surface of the flexible portion 13e, the flexible portion 13e may be arranged in the casing 11 so that the flowing direction of the air is parallel to the surface of the flexible portion 13e.

Alternatively, the device may have no cooling fan 19.

The rigid flexible board 13 may be manufactured by another method other than the above described method.

The device may be another equipment other than the vehicle navigation device. Although the CPU 14 is mounted on the first rigid portion 13a and the memories 15, 16 and the IC 17 are mounted on the second to fourth rigid portions 13b-13d, respectively, other electric elements may be mounted on the first to fourth rigid portions 13a-13d. Although the number of the rigid portions 13a-13d is four, the number of the rigid portions 13a-13d may be two or more.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electric device comprising:

first and second electric elements, wherein electric power consumption of the first electric element is larger than that of the second electric element, and wherein an operation temperature limit of the first electric element is higher than that of the second electric element;

a substrate, on which the first and second electric elements are disposed;

a casing that accommodates the substrate with the first and second electric elements; and a cooling fan disposed in the casing, wherein the substrate is made of a rigid flexible board, the substrate includes first and second rigid portions and a flexible portion, the first electric element is disposed on the first rigid portion, and the second electric element is disposed on the second rigid portion opposite to the first electric element, so that the first rigid portion is located between the first and second electric elements, the flexible portion connects the first and second rigid portions, the flexible portion has a thickness, which is smaller than the first and second rigid portions, the flexible portion further includes a wiring, the first and second electric elements are electrically coupled with the wiring so that high speed communication is performed between the first and second electric elements, the casing includes a suction opening, the suction opening introduces the air into an inside of the casing, the cooling fan blows the air toward an outside of the casing so that the first rigid portion is cooled, the air flows from the suction opening to the cooling fan through the inside of the casing so that an air flow direction in the casing is parallel to the substrate, the first rigid portion is disposed over the second rigid portion so that the first rigid portion is spaced apart from the second rigid portion, the first rigid portion is parallel to the second rigid portion, and the flexible portion is curved.

2. The electric device according to claim 1, wherein the flexible portion has a stripe shape, which is divided by a slit.

3. The electric device according to claim 1, wherein the rigid flexible board is a multi-layered circuit board, the flexible portion further includes a pair of films, which sandwich the wiring so that the wiring is disposed in the flexible portion, and each of the first and second rigid portions includes the wiring for connecting the first and second electric elements.

4. The electric device according to claim 3, wherein the flexible portion is formed in a lattice configuration of an alternating plurality of flexible portions and slits, and the wiring is disposed in at least one of the flexible portions in the lattice configuration.

5. The electric device according to claim 4, wherein the cooling fan blows the air along with a blowing direction, which is parallel to a surface of the flexible portion.

6. The electric device according to claim 4, wherein the cooling fan blows the air along with a blowing direction, which is perpendicular to a surface of the flexible portion.

7. The electric device according to claim 1, wherein the first electric element is a micro processor, and the second electric element is a high speed memory.

8. An electric device comprising:

a substrate including a first rigid portion, a second rigid portion spaced apart from the first rigid portion, and a flexible portion that includes a wiring pattern, and that connects the first rigid portion and the second rigid portion and that has a thickness that is smaller than respective thicknesses of the first and second rigid portions;

first and second electric elements that are provided on the first and second rigid portions, respectively, electrical power consumption of the first electric element is larger than that of the second electric element, and an operational temperature limit of the first electric element is higher than that of the second electric element; and a casing that accommodates the substrate with the first and second electric elements; wherein the first and second electric elements are spaced apart from each other through the first and second rigid portions and the flexible portion, and are electrically coupled with the wiring pattern, and the first rigid portion is provided over the second rigid portion to limit conduction of heat from the first electric element through the first rigid portion to the second electric element.

9. The electric device according to claim 8, wherein the flexible portion is formed in a lattice configuration of an alternating plurality of flexible portions and slits, and the wiring pattern is disposed in at least one of the flexible portions in the lattice configuration.

10. The electric device according to claim 8, wherein the first rigid portion is disposed over, spaced apart from and in parallel with the second rigid portion, and the flexible portion is curved.

11. The electric device according to claim 10, further comprising:

a cooling fan disposed in the casing for blowing air to cool the first rigid portion.

12. The electric device according to claim 11, wherein the casing includes a suction opening for introducing air into an inside of the casing, and the cooling fan blows the air toward an outside of the casing so that the air flows from the suction opening to the cooling fan through the inside of the casing.

* * * * *